(12) United States Patent
Hara et al.

(10) Patent No.: US 11,532,972 B2
(45) Date of Patent: Dec. 20, 2022

(54) DRIVING DEVICE

(71) Applicant: DENSO CORPORATION, Kariya (JP)

(72) Inventors: Yoshimichi Hara, Kariya (JP); Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 331 days.

(21) Appl. No.: 16/855,242

(22) Filed: Apr. 22, 2020

(65) Prior Publication Data
US 2020/0366163 A1  Nov. 19, 2020

(30) Foreign Application Priority Data

May 17, 2019 (JP) .............................. JP2019-093614

(51) Int. Cl.
*H02K 11/33* (2016.01)
*H05K 1/18* (2006.01)
(Continued)

(52) U.S. Cl.
CPC ........... *H02K 11/33* (2016.01); *B62D 5/0406* (2013.01); *B62D 5/0412* (2013.01); *H02K 9/223* (2021.01); *H02K 11/215* (2016.01); *H05K 1/0203* (2013.01); *H05K 1/181* (2013.01); *H02K 2211/03* (2013.01); *H02K 2213/06* (2013.01); *H05K 2201/066* (2013.01);
(Continued)

(58) Field of Classification Search
CPC .......... H02K 9/22; H02K 11/33; H02K 9/223; H02K 11/215; H02K 7/116; H02K 3/522; H02K 5/1737; H02K 5/22; H02K 5/225; H05K 1/0203; H05K 1/0209; H05K 1/181; B62D 5/0412; B62D 5/0406
See application file for complete search history.

(56) References Cited

U.S. PATENT DOCUMENTS

2012/0098361 A1* 4/2012 Yamasaki .............. H02K 11/33
310/52
2015/0327354 A1  11/2015 Umeno
(Continued)

FOREIGN PATENT DOCUMENTS

JP  2015-216141 A  12/2015
JP  2016-034203 A  3/2016
(Continued)

*Primary Examiner* — Leda T Pham
(74) *Attorney, Agent, or Firm* — Maschoff Brennan

(57) ABSTRACT

A driving device includes an electric motor, a rotating shaft, a motor housing, a printed circuit board, an electric power converting circuit, a rear frame end working as a heat radiating member, gel working as a heat transfer member, multiple mounted parts and so on. The heat radiating member is located on a side of the printed circuit board and facing a motor-side surface of the printed circuit board, to which multiple switching elements are mounted. The gel is plastically deformed and adhered to the switching elements and the heat radiating member for transferring heat of the switching elements to the heat radiating member. At least one of the mounted parts is mounted to the printed circuit board and located at a position between a through-hole opposing area and one of the switching elements, which is located at a position closest to a rotational angle sensor mounted to the printed circuit board in the through-hole opposing area.

7 Claims, 10 Drawing Sheets

(51) Int. Cl.
*H05K 1/02* (2006.01)
*H02K 11/215* (2016.01)
*B62D 5/04* (2006.01)
*H02K 9/22* (2006.01)

(52) U.S. Cl.
CPC .............. *H05K 2201/09063* (2013.01); *H05K 2201/10151* (2013.01); *H05K 2201/10522* (2013.01)

(56) References Cited

U.S. PATENT DOCUMENTS

| | | |
|---|---|---|
| 2016/0037659 A1 | 2/2016 | Yamanaka |
| 2018/0191240 A1 | 7/2018 | Doi et al. |
| 2018/0201302 A1* | 7/2018 | Sonoda ................. B62D 5/046 |
| 2019/0029107 A1 | 1/2019 | Nagashima et al. |
| 2019/0052154 A1 | 2/2019 | Sugiura |

FOREIGN PATENT DOCUMENTS

| | | |
|---|---|---|
| JP | 2017-143203 A | 8/2017 |
| JP | 2018-182162 A | 11/2018 |

* cited by examiner

DRIVING DEVICE

CROSS REFERENCE TO RELATED APPLICATION

This application is based on Japanese Patent Application No. 2019-093614 filed on May 17, 2019, the disclosure of which is incorporated herein by reference.

FIELD OF TECHNOLOGY

The present disclosure relates to a driving device having an electric motor and an electric power converting circuit.

BACKGROUND

A driving device is known in the art, according to which an electric power converting circuit is integrally assembled to an electric motor. The driving device includes a printed circuit board, to which switching elements for forming the electric power converting circuit are mounted, and a motor housing for accommodating the electric motor and supporting the printed circuit board. An opening portion is formed in a part of the motor housing, through which a rotating shaft of the electric motor is inserted. The printed circuit board is located at a position opposing to the opening portion.

In the driving device of the above prior art, heat radiating gel is provided for thermally connecting the switching elements to the motor housing. The heat radiating gel is adhered to the switching elements and the motor housing, so that heat generated at the switching elements is effectively radiated from the motor housing to an outside of the driving device.

In a case that an amount of the gel to be adhered to the switching elements is insufficient, the gel is not sufficiently adhered to the switching elements and the motor housing and a high heat radiating performance may not be obtained. Therefore, the amount of the gel to be adhered is so decided at such a value that the gel sufficiently enters spaces between the switching elements and the motor housing and the gel to be plastically deformed properly overflows from the spaces.

On the other hand, when the gel is excessively adhered to the switching elements, the gel overflowing from the switching elements may be adhered to the rotating shaft of the electric motor and thereby a smooth rotation of the rotating shaft may be prevented. It is, therefore, necessary to overcome not only a problem that the heat radiating performance is decreased due to the insufficient amount of the gel but also a problem that the smooth rotation of the rotating shaft is decreased by the excessive amount of the gel.

SUMMARY OF THE DISCLOSURE

The present disclosure is made in view of the above problem. It is an object of the present disclosure to provide a driving device, according to which an electric power converting circuit is integrally assembled to an electric motor, and according to which heat radiating performance of switching elements and smooth rotation of a rotating shaft can be obtained.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
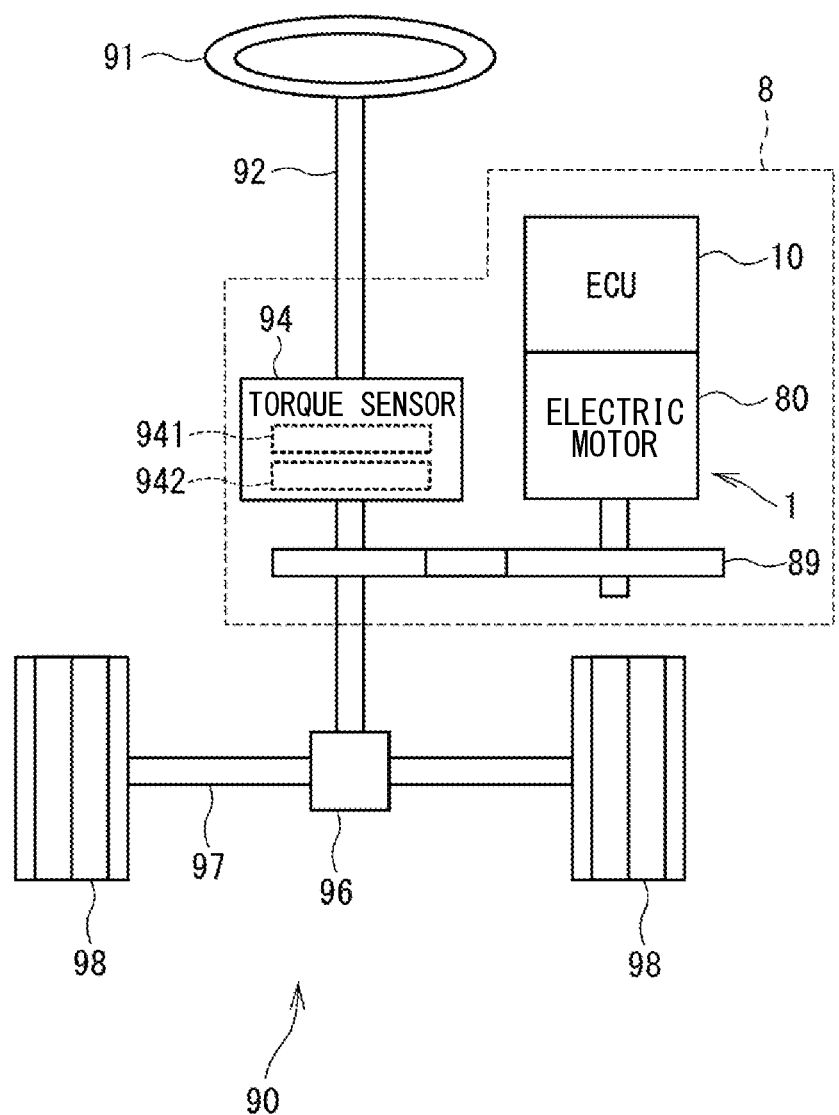
FIG. 1 is a schematic view showing an outline of an electric power steering system, to which a driving device according to a first embodiment of the present disclosure is applied.

The present disclosure will be explained hereinafter by way of multiple embodiments and/or modifications with reference to the drawings. The same reference numerals are given to the same or similar structures and/or portions in order to avoid repeated explanation.

First Embodiment

As shown in FIG. 1, a driving device 1 according to a first embodiment of the present disclosure includes an electric motor 80 and an electronic control unit 10 (hereinafter, the ECU 10) as an electric power converting circuit. The driving device 1 is applied to an electric power steering device 8 (hereinafter, the EPS 8) for assisting a steering operation of a vehicle driver for an automotive vehicle (hereinafter, the vehicle). FIG. 1 shows an entire structure of a steering system 90 having the EPS 8. The steering system 90 includes a steering wheel 91, a steering shaft 92, a pinion gear 96, a rack shaft 97, vehicle wheels 98, the EPS 8 and so on.

The steering wheel 91 is connected to the steering shaft 92. A torque sensor 94 is provided in the steering shaft 92 for detecting a steering torque. The torque sensor 94 includes a first torque detecting portion 941 and a second torque detecting portion 942, each of which is provided for the respective control system (explained below). A detected value of each torque detecting portion 941/942 is respectively outputted to each of micro-computers 170 and 270 (FIG. 3) of the respective control system. The pinion gear 96 is provided at a forward end of the steering shaft 92. The pinion gear 96 is engaged with the rack shaft 97. The vehicle wheel 98 is connected to each end of the rack shaft 97 via a tie rod (not shown).

When the steering wheel 91 is rotated by the vehicle driver, the steering shaft 92 connected to the steering wheel 91 is rotated. A rotational movement of the steering shaft 92 is converted to a linear movement of the rack shaft 97 via the pinion gear 96. A travelling direction of each vehicle wheel 98 is changed to a steering angle depending on a displacement amount of the rack shaft 97.

The EPS 8 includes the driving device 1, a speed reduction gear 89 and so on. The speed reduction gear 89 works as a power transmitting portion, which reduces rotation of the electric motor 80 and transmits such reduced rotation to the steering shaft 92. The steering shaft 92 is a driving subject of the EPS 8.

Figure 2:
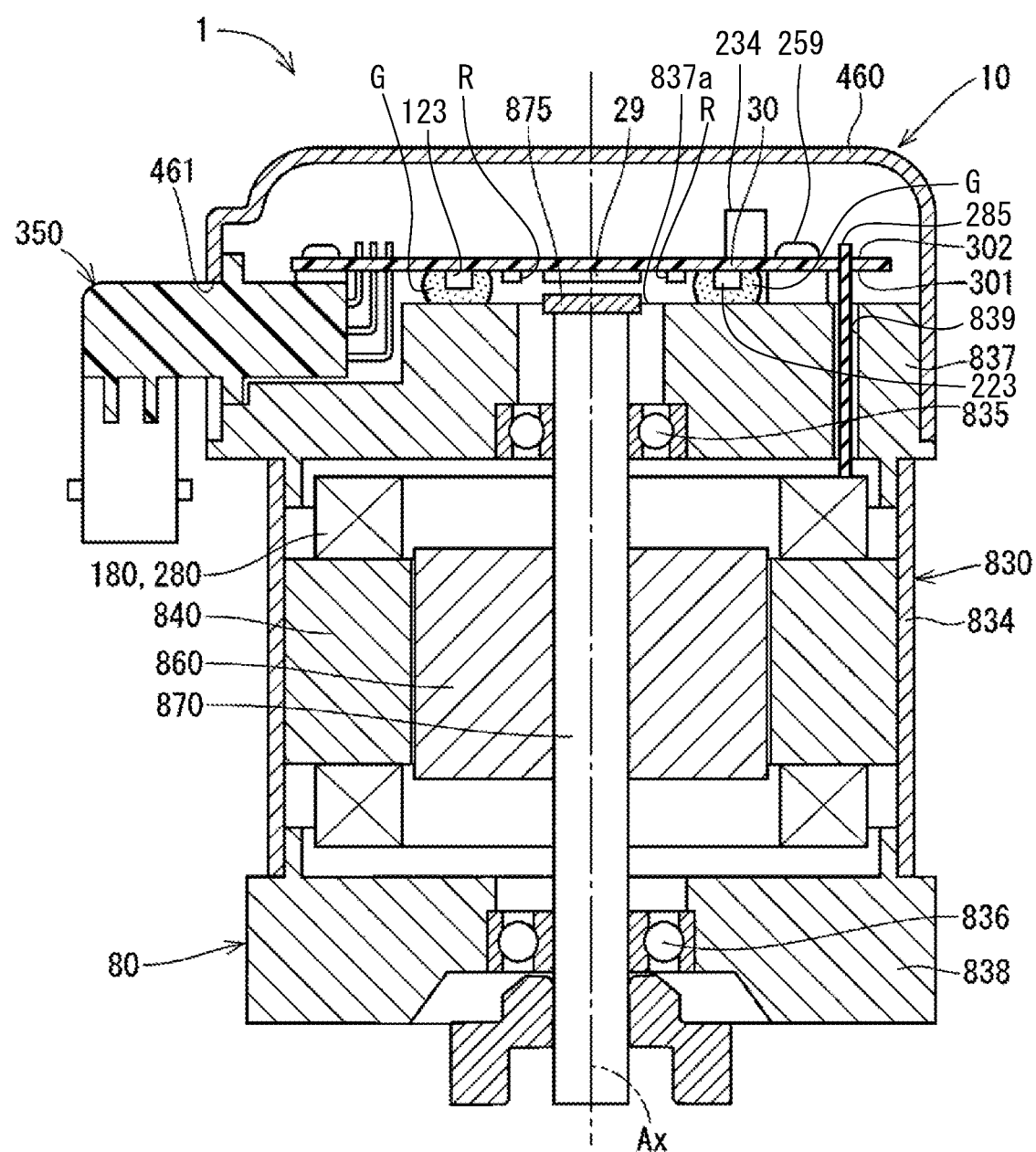
FIG. 2 is a schematic cross-sectional view showing the driving device of the first embodiment.
Figure 3:
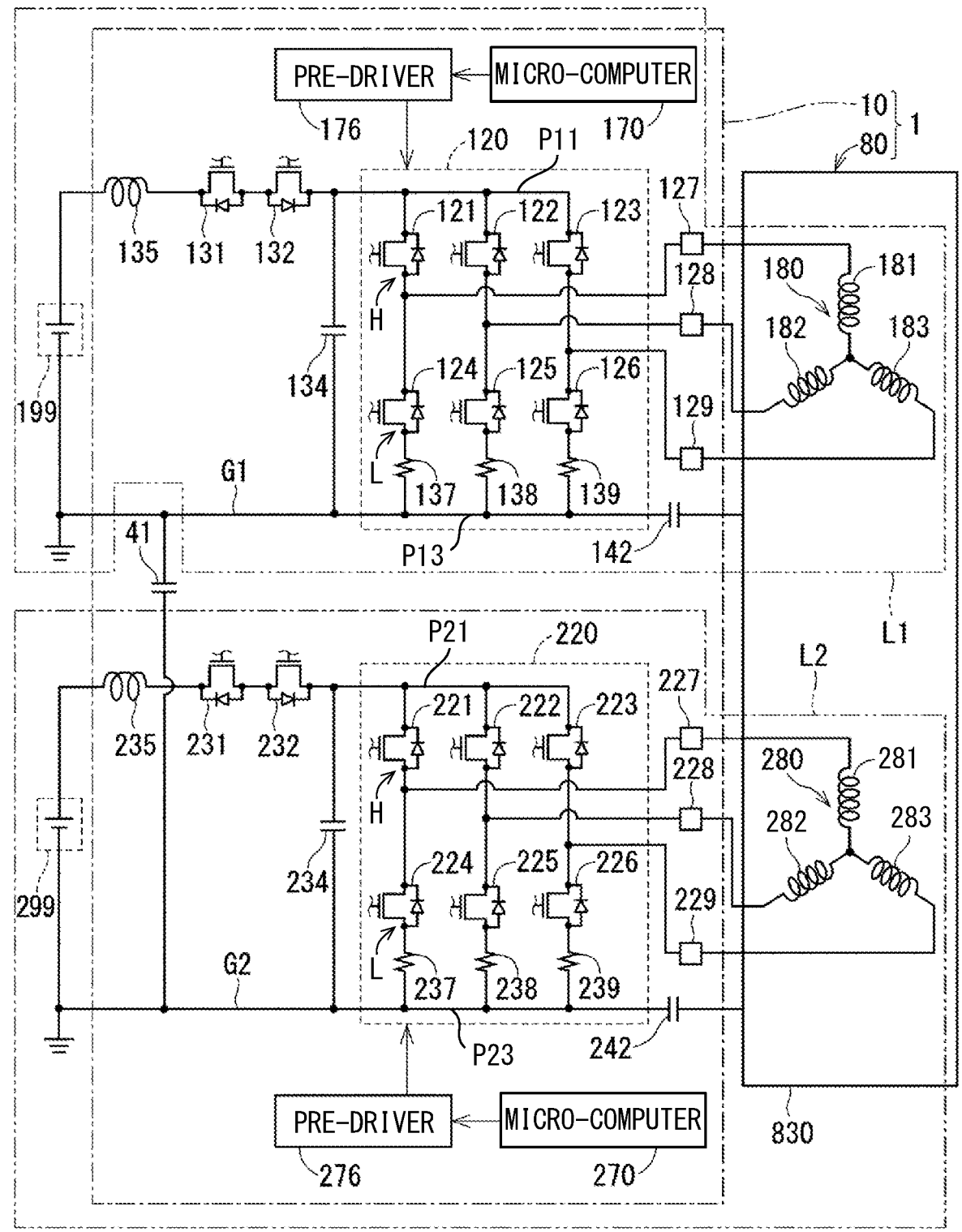
FIG. 3 is a schematic view showing an electric power converting circuit of the driving device of the first embodiment.

As shown in FIGS. 2 and 3, the electric motor 80 is composed of a three-phase brushless motor. The electric motor 80 outputs a part of or whole of torque, which is necessary for steering the vehicle. The electric motor 80 is rotated when electric power is supplied to the electric motor 80 from each of first and second batteries 199 and 299. The electric motor 80 rotates the speed reduction gear 89 in a forward direction or in a backward direction.

The electric motor 80 has a first winding group 180 and a second winding group 280. An electrical specification of the first winding group 180 is equal to that of the second winding group 280. Each phase coil of the first and the second winding groups 180 and 280 is wound on a common stator 840 by a cancel-winding method, wherein an electrical angle of the first winding group 180 is displaced from that of the second winding group 280 by 30 degrees. Therefore, electric phase current to the first winding group 180 has a phase "ϕ", which is displaced from a phase of electric phase current to the second winding group 280 by 30 degrees.

The control system for controlling the electric current to the first winding group 180 is referred to as a first power control system L1, while the control system for controlling the electric current to the second winding group 280 is referred to as a second power control system L2. In the present embodiment, a triple-digit reference number of one hundred is given to each part or component of the first power control system L1, while a triple-digit reference number of two hundreds is given to each part or component of the second power control system L2. The same last two-digit number is given to the part or the component of the second power control system L2, which is the same to the part or the component of the first power control system L1. A structure of the first power control system L1 will be mainly explained and explanation for the structure of the second power control system L2 will be omitted as much as possible.

As shown in FIG. 2, the driving device 1 includes the ECU 10, which is integrally assembled to the electric motor 80 at its axial end. The driving device 1 is a mechatronics product, wherein a mechanical unit and an electrical unit are integrally formed with each other as one unit. The ECU 10 is provided at the axial end of the electric motor 80, which is one of axial sides of the electric motor 80 opposite to a side on which the speed reduction gear 89 (FIG. 1) is provided. The ECU 10 is coaxially arranged with a center axis Ax of a rotating shaft 870 of the electric motor 80. It is possible to effectively locate the ECU 10 and the electric motor 80 in the vehicle having a restriction for a space, in which the driving device 1 is mounted, because the ECU 10 and the electric motor 80 are integrally formed with each other. In the present disclosure, an axial direction of the electric motor 80 is simply referred to as the axial direction, while a radial direction of the electric motor 80 is simply referred to as the radial direction.

The electric motor 80 includes the stator 840, a rotor 860, the rotating shaft 870, the first winding group 180, the second winding group 280 and so on. The stator 840 is accommodated in and fixed to a motor housing 830, in a condition that the phase coils of the first and the second winding groups are wound on the stator 840. The rotor 860 is movably provided in a radial-inside space of the stator 840, so that the rotor 860 is rotatable relative to the stator 840.

The rotating shaft 870 is inserted through and fixed to the rotor 860 so that the rotating shaft 870 is rotated together with the rotor 860. The rotating shaft 870 is rotatably supported by the motor housing 830 by bearings 835 and 836. An axial end of the rotating shaft on a side of the ECU 10 (an upper-side end n FIG. 2) is protruding to the ECU 10 through a through-hole 837a of the motor housing 830 (more exactly, a rear frame end 837). A magnet 875, a rotational position of which is detected by a rotational angle sensor 29 (explained below), is provided at the upper-side end of the rotating shaft 870.

The motor housing 830 includes a cylindrical casing 834, the rear frame end 837 at an upper side of the cylindrical casing 834, and a front frame end 838 at a lower side of the cylindrical casing 834.

Figure 4:
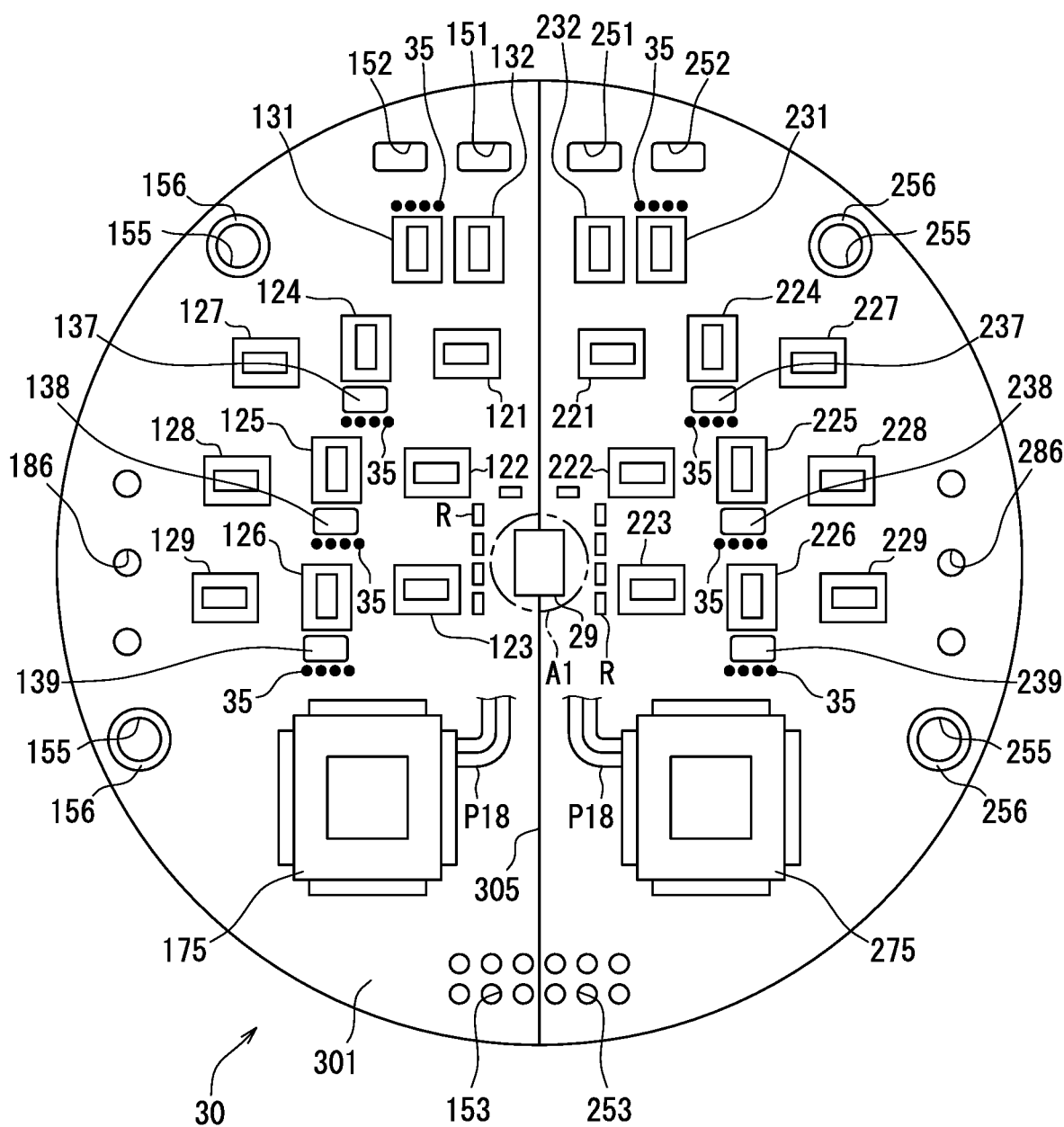
FIG. 4 is a schematically enlarged plane view showing a printed circuit board of the driving device of FIG. 2, when viewed it in an axial direction from a bottom side thereof (in the axial direction from an electric motor to the printed circuit board)
Figure 5:
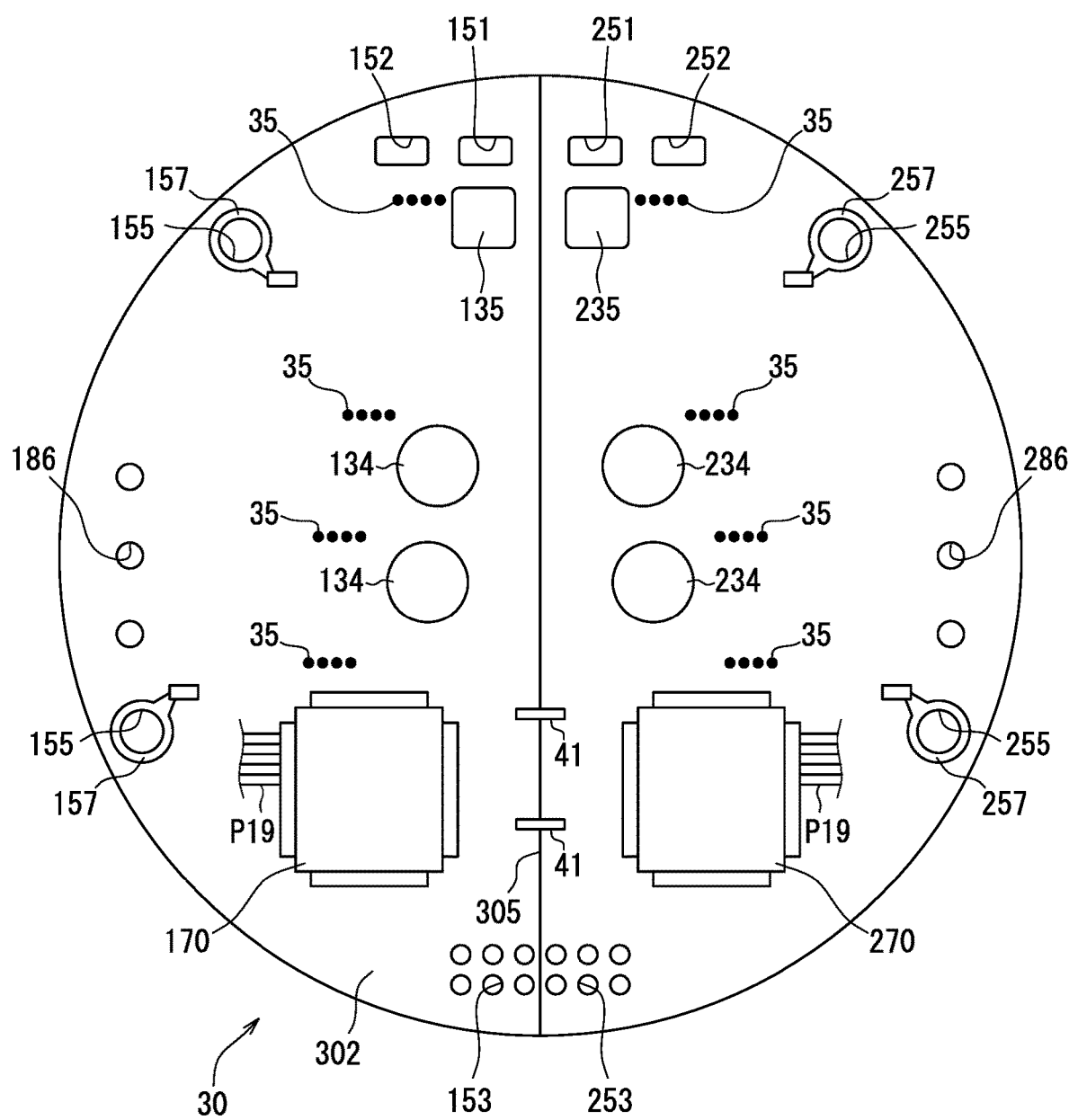
FIG. 5 is a schematically enlarged plane view showing the printed circuit board of the driving device of FIG. 2, when viewed it in the axial direction from an upper side thereof (in the axial direction from a cover member to the printed circuit board)

The through-hole 837a is formed in the rear frame end 837, through which the rotating shaft 870 passes. Multiple lead-wire insertion holes 839 are formed in the rear frame end 837, through which lead wires 285 pass, although only one lead-wire insertion hole 839 is shown in FIG. 2. Each of the lead wires 285 is connected to respective phase coils of the first and the second winding groups 180 and 280. Each of the lead wires 285 is pulled out from each of the lead-wire insertion holes 839 to an upper side of the rear frame end 837 (to a side of the ECU 10). Each of the lead wires 285 is respectively inserted into motor-wire connecting portions 186 and 286 (FIGS. 4 and 5). Each of the lead wires 285 is electrically connected to a printed circuit board 30 by soldering or the like.

The ECU 10 includes the printed circuit board 30 and various kinds of electronic parts and components to be mounted to the printed circuit board 30. The printed circuit board 30 is fixed by bolts 259 to an upper-side surface of the rear frame end 837 (a surface opposite to the electric motor 80). Each of the bolts 259 is inserted into each of board connecting portions 155 and 255 (FIGS. 4 and 5). The bolts 259 are made of electrically conducting material. A lower-side surface of the printed circuit board 30 (the surface facing to the electric motor 80) is referred to as a motor-side surface 301. An upper-side surface of the printed circuit board 30 (the opposite side) is referred to a cover-side surface 302. A cover member 460 is formed in a cylindrical shape having a closed end at its upper-side end. The cover member 460 is fitted to a radial-outer side of the rear frame end 837. The cover member 460 covers the printed circuit board 30 to protect the ECU 10 from outside impact. The cover member 460 prevents water and/or dust from entering the ECU 10. An opening portion 461 is formed in the cover member 460 at its lower-side end.

A connector unit 350 includes connector terminals, such as, a first battery terminal, a first ground terminal, first signal terminals, a second battery terminal, a second ground terminal, second signal terminals and so on. Each of the first battery terminal, the first ground terminal and the first signal terminals of the connector unit 350 is respectively inserted into a first battery-terminal connecting portion 151, a first ground-terminal connecting portion 152 and first signal-terminal connecting portions 153 of the printed circuit board 30 in the axial direction to the motor surface 301 (FIGS. 4 and 5). In a similar manner, each of the second battery terminal, the second ground terminal and the second signal terminals of the connector unit 350 is respectively inserted into a second battery-terminal connecting portion 251, a second ground-terminal connecting portion 252 and second signal-terminal connecting portions 253 of the printed circuit board 30 in the axial direction to the motor surface 301 (FIGS. 4 and 5). As above, each of the terminals is electrically connected to the corresponding connecting portion.

FIG. 3 shows a structure of an electrical power converting circuit of the driving device 1. The ECU 10 includes a first inverter 120, first motor relays 127 to 129, first battery relays 131 and 132, a first capacitor 134 and a first coil 135, each of which is provided for the first winding group 180. In a similar manner, the ECU 10 includes a second inverter 220, second motor relays 227 to 229, second battery relays 231 and 232, a second capacitor 234 and a second coil 235, each of which is provided for the second winding group 280.

In the first power control system L1, electric power is supplied from the first battery 199 to the first inverter 120 and the other parts and components. In the second power control system L2, the electric power is supplied from the second battery 299 to the second inverter 220 and the other parts and components. In the present embodiment, the ground for the first power control system L1 is separately provided from that of the second power control system L2. Current supply to the phase coils of the first winding group 180 is controlled by the first micro-computer 170, while current supply to the phase coils of the second winding group 280 is controlled by the second micro-computer 270. In other words, in the present embodiment, the first power control system L1 is independently provided from the second power control system L2. The ECU 10 has a complete redundant configuration.

The first inverter 120 is composed of a three-phase inverter, wherein first switching elements 121 to 126 are electrically connected to form bridge circuits. Each of the switching elements 121 to 123 is connected to a high-voltage side and forms an upper-side arm H. Each of the switching elements 124 to 126 is connected to a low-voltage side and forms a lower-side arm L. An intermediate connecting point of the switching elements 121 and 124, which form a pair of switching elements for a first U-phase coil 181, is connected to one end of the first U-phase coil 181. In a similar manner, an intermediate connecting point of the switching elements 122 and 125, which form a pair of switching elements for a first V-phase coil 182, is connected to one end of the first V-phase coil 182. An intermediate connecting point of the switching elements 123 and 126, which form a pair of switching elements for a first W-phase coil 183, is likewise connected to one end of the first W-phase coil 183. Each of the other ends of the phase coils 181 to 183 is connected to one another. Each of shunt resistors 137 to 139 is provided in the low-voltage side of the switching elements 124 to 126. Each of the shunt resistors 137 to 139 is a current detecting element for detecting the phase current to the phase coils 181 to 183.

The second inverter 220 has the same structure to that of the first inverter 120. Each of second switching elements 221 to 223 is connected to the high-voltage side and forms the upper-side arm H. Each of second switching elements 224 to 226 is connected to the low-voltage side and forms the lower-side arm L. An output point (the intermediate connecting point) of a high-low arm circuit for each of the U-phase, the V-phase and the W-phase coils 281 to 283 is respectively connected to each one end of the phase coils 281 to 283. Each of shunt resistors 237 to 239 is provided in the low-voltage side of the switching elements 224 to 226. Each of the shunt resistors 237 to 239 is a current detecting element for detecting the phase current to the phase coils 281 to 283.

Each of those shunt resistors 137-139 and 237-239 corresponds to a current detecting circuit for detecting the current flowing through an arm of each current phase. A current value detected by each current detecting circuit is inputted to each of the micro-computers 170 and 270. Each of the micro-computers 170 and 270 corresponds to a control circuit for controlling an operation of each of the inverters 120 and 220 based on the current value detected by the current detecting circuit.

Each of the first motor relays 127 to 129 is provided between the first inverter 120 and the respective phase coils 181 to 183 of the first winding group 180 for connecting them to each other or disconnecting them from each other. The motor relay 127 for the U-phase is provided between the intermediate connecting point of the switching elements 121 & 124 and the U-phase coil 181. In a similar manner, the motor relay 128 for the V-phase is provided between the intermediate connecting point of the switching elements 122 & 125 and the V-phase coil 182. The motor relay 129 for the W-phase is likewise provided between the intermediate connecting point of the switching elements 123 & 126 and the W-phase coil 183. The second motor relays 227 to 229 have the same structures to those of the first motor relays 127 to 129. Each of the second motor relays 227 to 229 is provided for each of the U-phase, the V-phase and the W-phase.

The first battery relays 131 and 132 are connected in series in such a way that a direction of a parasitic diode is opposed to each other. The first battery relays 131 and 132 are provided between the first battery 199 and the first inverter 120. In a similar manner, the second battery relays 231 and 232, which are connected in series in such a way that the direction of the parasitic diode is opposed to each other, are provided between the second battery 299 and the second inverter 220. According to the above structure, it is possible to avoid a situation that electric current flows in a reversed direction when the battery 199 and/or 299 is connected in a reversed condition. It is thereby possible to protect the ECU 10.

A first pre-driver circuit 176 outputs driving signals based on a control signal from the first micro-computer 170. Each of the first switching elements 121-126, the first motor relays 127-129 and the first battery relays 131-132 is controlled by the driving signal so that each of them is turned on or turned off. A second pre-driver circuit 276 for the second power control system L2 has the same function to that of the first pre-driver circuit 176 of the first power control system L1. Namely, each of the second switching elements 221-226, the second motor relays 227-229 and the second battery relays 231-232 is controlled by the second pre-driver circuit 276 so that each of them is turned on or turned off. For the purpose of simplicity, control lines to the motor relays and the battery relays are omitted in FIG. 3.

The first capacitor 134 is connected in parallel to the first inverter 120, while the second capacitor 234 is connected in parallel to the second inverter 220. Each of the capacitors 134 and 234 is composed of, for example, an aluminum electrolytic capacitor. The first coil 135 is provided between the first battery 199 and the first battery relay 131, while the second coil 235 is provided between the second battery 299 and the second battery relay 231, The first capacitor 134 and the first coil 135 as well as the second capacitor 234 and the second coil 235 form a filter circuit. The filter circuit decreases noises to be transmitted from other electric and/or electronic devices, which commonly use the battery 199 or 299. In addition, the filter circuit decreases noises to be transmitted to the other electric and/or electronic devices, which commonly use the battery 199 or 299. Each of the first and the second capacitors 134 and 234 stores electric charge, to thereby assist in supplying the electric power to each of the first and the second inverters 120 and 220.

A ground-connecting capacitor 41 is provided between a first ground line G1 and a second ground line G2. A first motor ground capacitor 142 connects the motor housing 830 of the electric motor 80 to the first ground line G1. A second motor ground capacitor 242 connects the motor housing 830 of the electric motor 80 to the second ground line G2. Each of the capacitors 41, 142 and 242 is made of, for example, ceramic capacitor.

The motor-side surface 301 of the printed circuit board 30 is shown in FIG. 4. The cover-side surface 302 of the printed circuit board 30 is shown in FIG. 5. For the purpose of explanation, the locations of the parts and components on the cover-side surface 302 are reversed, so that a left-hand side on each of the drawing sheets of FIG. 4 and FIG. 5 shows those parts and components of the first power control system L1, while a right-hand side in the drawing shows the parts and components of the second power control system L2.

As shown in FIG. 4, the switching elements 121-126 & 221-226 and the shunt resistors 137-139 & 237-239 are mounted to the motor-side surface 301 of the printed circuit board 30. In addition, the motor relays 127-129 & 227-229 and the battery relays 131-132 & 231-232 are mounted to the motor-side surface 301 of the printed circuit board 30. Furthermore, a first and a second consolidated ICs 175 and 275 and the rotational angle sensor 29 (a sensor element) are mounted to the motor-side surface 301 of the printed circuit board 30. The first consolidated IC 175 includes the first pre-driver circuit 176, while the second consolidated IC 275 includes the second pre-driver circuit 276. The rotational angle sensor 29 detects a change of a magnetic field of the magnet 875 fixed to the rotating shaft 870 and outputs a detection signal depending on the rotational angle of the rotating shaft 870.

As shown in FIG. 5, the first and the second capacitors 134 and 234 as well as the first and the second coils 135 and 235 are mounted to the cover-side surface 302 of the printed circuit board 30. In addition, the ground-connecting capacitor 41, the first and the second motor-ground capacitors 142 & 242 (FIG. 3), and the first and the second micro-computers 170 & 270 are mounted to the cover-side surface 302 of the printed circuit board 30.

As shown in FIGS. 4 and 5, the printed circuit board 30 is electrically divided into two areas by a slit 305. In one of the areas (a left-hand area in the drawings), the parts and components of the first power control system L1 are mounted to the motor-side surface 301 and the cover-side surface 302 of the printed circuit board 30. In the other area (a right-hand area in the drawings), the parts and components of the second power control system L2 are mounted to the motor-side surface 301 and the cover-side surface 302 of the printed circuit board 30.

The rotational angle sensor 29 is located at a position (a center) of the printed circuit board 30, which is opposed to the through-hole 837a of the rear frame end 837 in the axial direction. The rotational angle sensor 29 is mounted to the motor-side surface 301 in such a way that it steps across the slit 305. The ground-connecting capacitors 41 are mounted to the cover-side surface 302 in such a way that each of them steps across the slit 305. The ground-connecting capacitor 41 connects the first ground line G1 and the second ground line G2 to each other, as explained above.

The first motor ground capacitor 142 connects a first ground pattern P13 (FIG. 3) of the first power control system L1 to a first housing-connecting pattern 157 (FIG. 5). The second motor ground capacitor 242 connects a second ground pattern P23 (FIG. 3) of the second power control system L2 to a second housing-connecting pattern 257 (FIG. 5). The motor housing 830 is thereby connected to a vehicle ground. Each of the capacitors 41, 142 and 242 is a capacitor, which connects each of the grounds to each other. The ground-connecting capacitor 41 connects the ground for the electric power converting circuit of the first power control system L1 to the ground for the electric power converting circuit of the second power control system L2.

In the present embodiment, the driving device 1 is applied to the EPS 8. Since in the EPS 8, large current flows in a short span of time, switching noise or ringing noise may be generated. Those noises "N" are mainly generated in the circuits of the ECU 10 and may be transmitted to a vehicle side via the connector unit 350 and/or the electric motor 80. The printed circuit board 30 is fixed to the motor housing 830 by the bolts 259, so that the ground of the printed circuit board 30 is electrically connected to the motor housing 830 to form a noise return passage from the electric motor 80 to the ECU 10. According to the above structure, the noises generated in the circuits of the ECU 10 return to a noise generating source and a noise transmission to the vehicle side can be suppressed.

Figure 6:
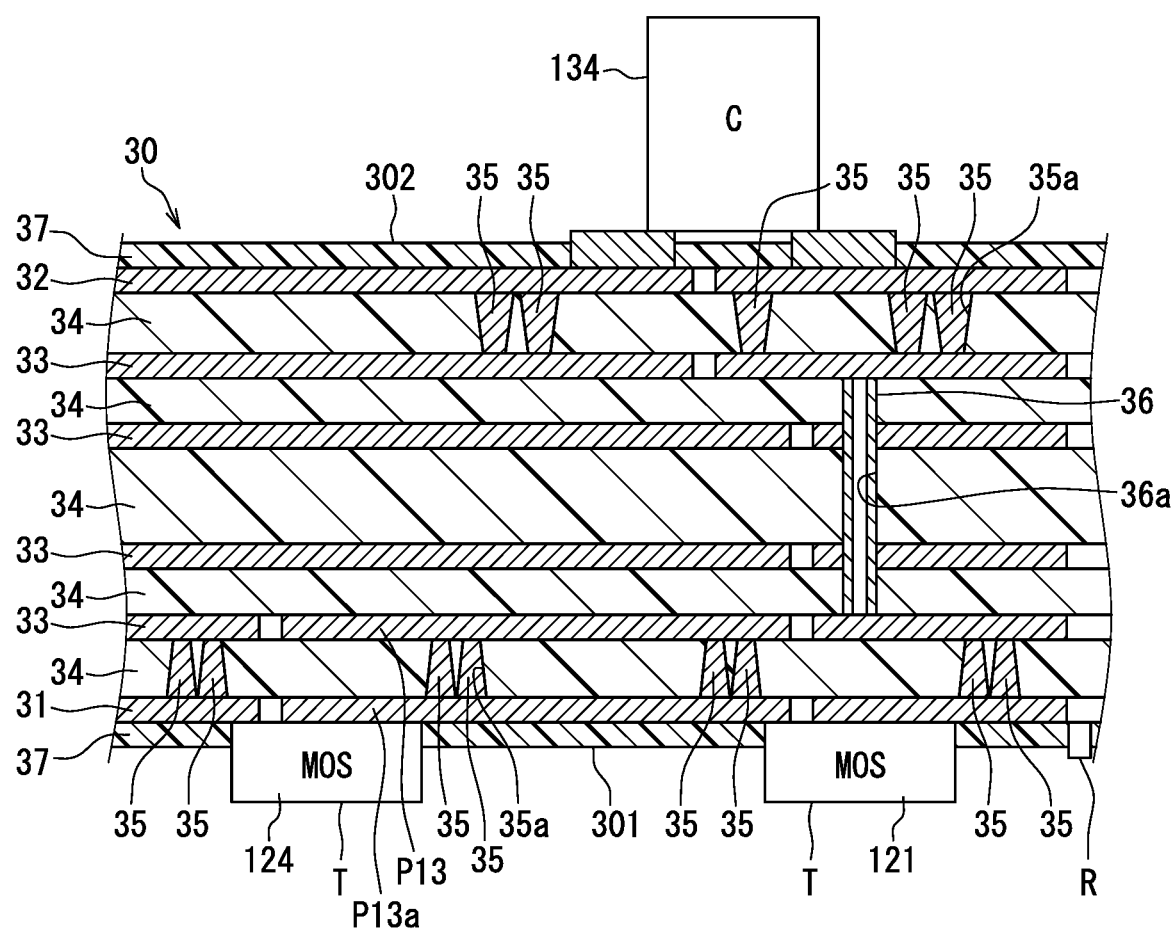
FIG. 6 is a schematically enlarged cross-sectional view showing a part of the printed circuit board of the first embodiment.

As shown in FIG. 6, the printed circuit board 30 of the present embodiment is composed of a multi-layer circuit board. Multiple pattern layers, multiple insulating layers 34, multiple surface resist layers 37, multiple vias and so on are formed in the printed circuit board 30. The wiring patterns made of electric conducting material are formed in the pattern layers. Each of the insulating layers 34 is formed between the neighboring pattern layers.

The pattern layers include a first and a second surface layers 31 and 32 and multiple inner layers 33. Each of the first and the second surface layers 31 and 32 is a layer located at an outer-most position of the printed circuit board 30. Each of the inner layers 33 is a layer located at an inside of the printed circuit board 30 between the first and the second surface layers 31 and 32. In the present embodiment shown in FIG. 6, the printed circuit board 30 includes four inner layers 33. Each of the first and the second surface layers 31 and 32 is covered with the surface resist layer 37. The surface resist layer 37 covering the first surface layer 31 (the lower-side layer in FIG. 6) forms the motor-side surface 301 of the printed circuit board 30. The surface resist layer 37 covering the second surface layer 32 (the upper-side layer in FIG. 6) forms the cover-side surface 302 of the printed circuit board 30.

The vias include through-hole vias (not shown) and inner vias 35a and 36a. The through-hole via has a shape passing through all of the pattern layers, which include the first and the second surface layers 31 & 32 and the inner layers 33. The inner via 35a has a shape passing through one of the first and the second surface layers 31 & 32 and one of the inner layers 33 neighboring to the surface layer 31/32. The inner via 36a has a shape passing through all of the inner layers 33 but not passing through the first and the second surface layers 31 and 32. Each of the inner vias 35a is formed by a laser processing, while the inner via 36a is formed by a drill processing.

A plated layer 36 made of the electrical conducting material is formed at an inner peripheral surface of each of the through-hole via and the inner via 36a. The plated layer 36 has a cylindrical shape having a space (a cylindrical inside space) in its inside. Non-conductive material (not shown) is filled into the cylindrical inside space of the inner via 36a. On the other hand, conductive material is filled into a cylindrical inside space of the inner via 35a. The conductive material is formed in a solid core shape. The inner via 35a having the conductive material of the solid core shape is referred to as a solid-core via 35. Each of the solid-core via 35 and the plated layer 36 electrically connects the wiring pattern formed in any one of the pattern layers to the wiring pattern formed in the other pattern layer. Each of the solid-core via 35 and the plated layer 36 is made of, for example, copper.

A part of the wiring patterns formed in the pattern layers works as a wire for electrically connecting the parts and/or components shown in FIG. 3 to one another. The wiring patterns include the first and the second ground patterns P13 and P23 and first and second battery patterns P11 and P21 (FIG. 3). Those wiring patterns are respectively formed for each of the first and the second power control systems L1 and L2.

As shown in FIG. 4, each of an upper-side MOS (Metal-Oxide Semiconductor), a lower-side MOS, a motor-relay MOS, a battery-relay MOS and the shunt resistors 137-139 & 237-239 has a rectangular shape, when viewed them in the axial direction. The upper-side MOS corresponds to each of the switching elements 121-123 & 221-223, each of which is provided in the upper-side arm H. The lower-side MOS corresponds to each of the switching elements 124-126 & 224-226, each of which is provided in the lower-side arm L. The motor-relay MOS corresponds to each of the motor relays 127-129 & 227-229. The battery-relay MOS corresponds to each of the battery relays 131-132 & 231-232. Hereinafter, the above switching elements and switching devices (the relays) are collectively referred to as the MOS. Each MOS is mounted to the printed circuit board 30 in such a manner that a longitudinal side or a short side of the MOS having the rectangular shape is arranged to be parallel to one another. In the present embodiment shown in FIG. 4, each of the longitudinal side or the short side of the rectangular shape is parallel to a boundary straight line of the printed circuit board 30 (the slit 305).

Figure 7:
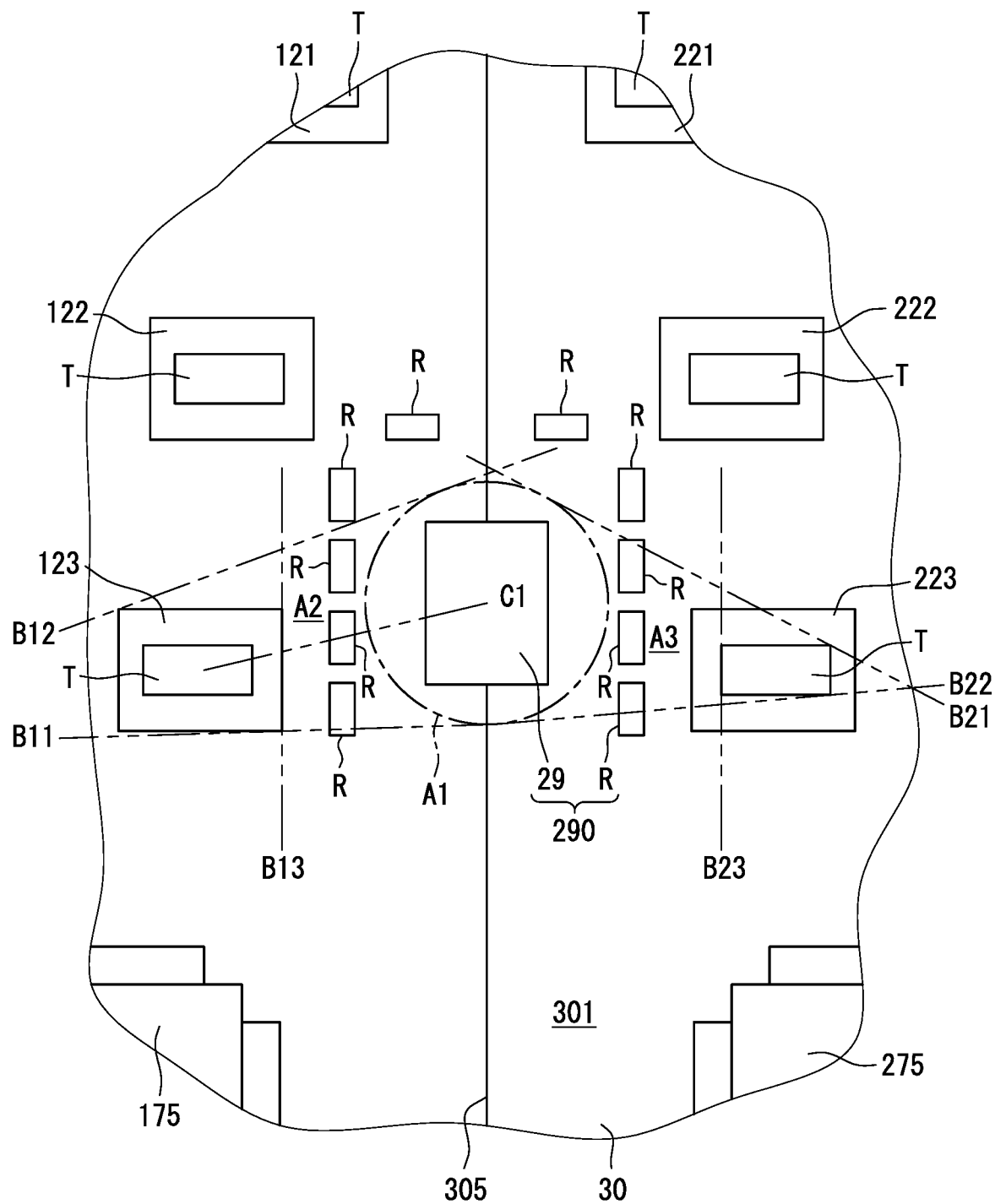
FIG. 7 is a schematically enlarged plane view showing a portion of the printed circuit board shown in FIG. 4, which includes a through-hole opposing area and the surrounding parts.
Figure 8:
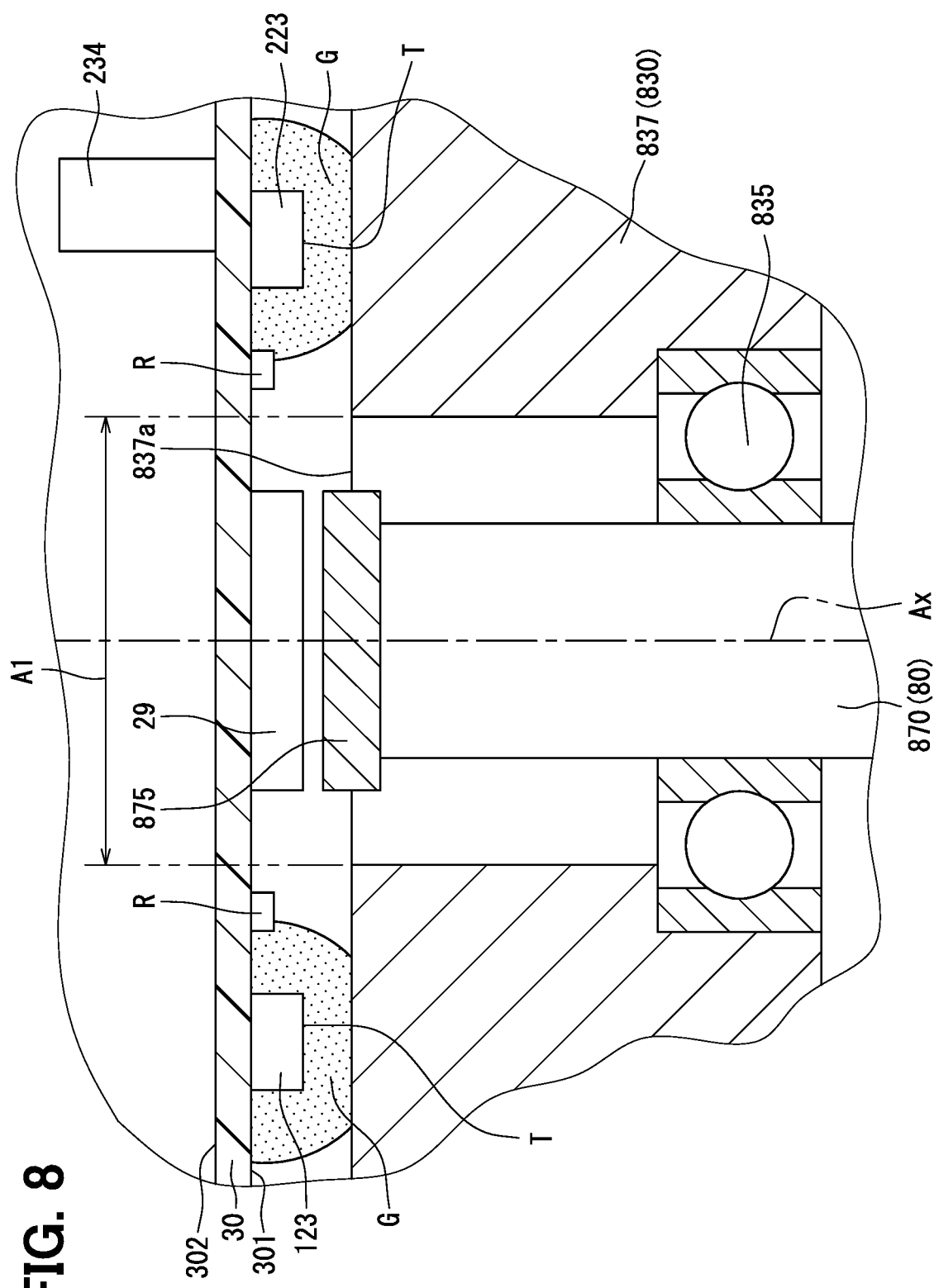
FIG. 8 is a schematically enlarged cross-sectional view showing a portion of the driving device shown in FIG. 2, which includes the through-hole opposing area and a rotating shaft of the electric motor.

Each MOS has a semiconductor, encapsulating resin for encapsulating the semiconductor, a terminal T outwardly extending from the encapsulating resin, as shown in FIG. 7. Gel G (the heat transfer material) is adhered to each of the terminals T, as shown in FIG. 8, wherein the gel G has an electrical insulating property and a high heat conductivity. The gel G is plastically deformed to be closely attached to the MOS (for example, the switching elements 123 and 223) and a heat radiating member (the rear frame end 837). The gel G works as a heat transfer member for transferring the heat from the MOS to the heat radiating member. For example, the gel G is located at a position between the MOS 123/223 and the rear frame end 837 and closely in contact with the rear frame end 837. The heat generated at the MOS 123/223 is transmitted to the rear frame end 837 made of metal through the gel G and then radiated into the air from the rear frame end 837. As above, the rear frame end 837 of the motor housing 830 works as the heat radiating member for radiating the heat generated at the MOS 123/223 to the outside of the electric motor 80.

Various kinds of electric and/or electronic parts and components (hereinafter, collectively referred to as the general mounted parts R) other than the MOS are also mounted to the motor-side surface 301 of the printed circuit board 30, to which the MOS is also mounted. For example, the general mounted parts R include a chip resistor, a chip capacitor, a chip diode and so on. Those general mounted parts R are used as such parts to be connected the MOS and/or such parts to be connected to the rotational angle sensor 29. For example, the general mounted parts R for the MOS include a resistor for regulating a gate voltage, a capacitor for removing noise applied to a gate, a diode for protecting the gate and so on. The general mounted parts R for the rotational angle sensor 29 include a capacitor for removing noise, a resistor for regulating voltage of a sensor signal and so on.

A layout of the general mounted parts R will be explained with reference to FIG. 7 and other drawings. At least one of the general mounted parts R is located at a position between the MOS 123/223 and a through-hole opposing area A1. The MOS 123/223 is located at a position closest to the rotational angle sensor 29 and the rotating shaft 870 (hereinafter, referred to as the sensor-closest MOS). The through-hole opposing area A1 is an area of the printed circuit board 30 opposing to the through-hole 837a of the rear frame end 837, when viewed it in the axial direction. One of the general mounted parts R, which is located between the sensor-closest MOS 123/223 and the through-hole opposing area A1, is referred to as a sensor-neighboring mounted part R. An entire portion of the sensor-neighboring mounted part R may be located at the position between the sensor-closest MOS 123/223 and the through-hole opposing area A1. Alternatively, a part of the sensor-neighboring mounted part R may be located at the position between the sensor-closest MOS 123/223 and the through-hole opposing area A1. In the present embodiment shown in FIG. 7, there are two sensor-neighboring mounted parts R for each of the first and the second power control systems L1 and L2, the entire portion of each of which is located at the position between the sensor-closest MOS 123/223 and the through-hole opposing area A1. In addition, there is one sensor-neighboring mounted part R for each of the first and the second power control systems L1 and L2, a part of which is located at the position between the sensor-closest MOS 123/223 and the through-hole opposing area A1.

More exactly, at least one of the general mounted parts R (three parts R in the present embodiment) is located at a position in a MOS-sensor in-between area A2, which is an area of the printed circuit board 30 formed between the sensor-closest MOS 123/223 and the through-hole opposing area A1, when viewed it in the axial direction. Furthermore, the MOS-sensor in-between area A2 is such an area, which is surrounded by tangential lines B11 and B12, the through-hole opposing area A1 and the sensor-closest MOS 123/223. Each of the tangential lines B11 and B12 extends between the sensor-closest MOS 123/223 and the through-hole opposing area A1. Each of the tangential lines B11 and B12 is indicated by two-dot-chain lines in FIG. 7 and each of them is described at such positions in the drawing that the MOS-sensor in-between area A2 is maximized.

A virtual line extending from one of sides of the rectangular shape of the sensor-closest MOS 123/223, which is located at the closest position to the through-hole opposing area A1, is referred to as a first virtual side line B13. The first virtual side line B13 extends in a direction parallel to the slit 305. It is more preferable that the sensor-neighboring mounted part/parts R is located at a position in the MOS-sensor in-between area A2, which is closer to the through-hole opposing area A1 than the first virtual side line B13.

A part of the MOS-sensor in-between area A2 is referred to as a terminal-sensor in-between area A3, as explained below and as indicated in the right-hand area of FIG. 7. The sensor-neighboring mounted part R, which is located in the MOS-sensor in-between A2, is preferably located in the terminal-sensor in-between area A3. An entire portion of the sensor-neighboring mounted part R may be located in the terminal-sensor in-between area A3, as shown in FIG. 7. Alternatively, a part of the sensor-neighboring mounted part R may be located in the terminal-sensor in-between area A3.

The terminal-sensor in-between area A3 corresponds to an area, which is formed between the terminal T of the sensor-closest MOS 123/223 and the through-hole opposing area A1, when viewed it in the axial direction. Furthermore, the terminal-sensor in-between area A3 is such an area, which is surrounded by tangential lines B21 and B22, the through-hole opposing area A1 and the terminal T, wherein each of the tangential lines B21 and B22 extends between the terminal T and the through-hole opposing area A1. Each of the tangential lines B21 and B22 is indicated by two-dot-chain lines in FIG. 7 and each of them is described at such position that the terminal-sensor in-between area A3 is maximized.

The terminal T of each MOS has a rectangular shape, when viewed it in the axial direction. One of sides of the rectangular shape of the terminal T is parallel to one of the sides of the rectangular shape of the MOS. A virtual line extending from one of the sides of the rectangular shape of the terminal T, which is located at a closest position to the through-hole opposing area A1, is referred to as a second virtual side line B23. The second virtual side line B23 extends in a direction parallel to the slit 305. It is more preferable that the sensor-neighboring mounted part R is located at a position in the terminal-sensor in-between area A3, which is closer to the through-hole opposing area A1 than the second virtual side line B23.

A line connecting a center of the through-hole opposing area A1 to a center of the sensor-closest MOS 123, which is indicated by a two-dot-chain line in FIG. 7, is referred to as a virtual center line C1. Multiple sensor-neighboring mounted parts R, which are located in the MOS-sensor in-between area A2, are arranged in a direction intersecting the virtual center line C1. In the present embodiment, as shown in FIG. 7, the multiple sensor-neighboring mounted parts R in the MOS-sensor in-between area A2 for the first power control system L1 are arranged in the direction, which is parallel to the first virtual side line B13, the slit 305 and the second virtual side line B23. The multiple sensor-neighboring mounted parts R in the MOS-sensor in-between area A2 for the second power control system L2 are arranged in the same manner. A distance between the respective sensor-neighboring mounted parts R in the direction of the arrangement of those parts (the parts arrangement direction) is smaller than a size of the sensor-neighboring mounted part R. In other words, the distance between the parts R in the parts arrangement direction is smaller than a length of the side of the rectangular shape of the sensor-neighboring mounted part R in the parts arrangement direction.

As explained above, the gel G is adhered to the terminal T of the MOS (including 123, 223) and the heat radiating member 837. A part of the gel G, which overflows from the space between the terminal T and the heat radiating member 837, is also in contact with the encapsulating resin of the MOS. In a case that an amount of the overflowing gel G is large, the gel G is further in contact with the printed circuit board 30, as shown in FIG. 8. In a case that the amount of the overflowing gel G is much more than that, the gel G may be brought into contact with the sensor-neighboring mounted parts R, as shown in FIG. 8.

(Advantages)

According to the driving device 1 of the present embodiment, the printed circuit board 30 is assembled to the motor housing 830 accommodating the electric motor 80, so that the electric power converting circuit (the ECU 10) is integrally formed with the electric motor 80. In addition, the sensor-neighboring mounted parts R are arranged on the motor-side surface 301 of the printed circuit board 30 at the position between the through-hole opposing area A1 and the sensor-closest MOS 123/223, when viewed them in the axial direction.

The sensor-neighboring mounted part/parts R has/have a function for preventing the gel G (the heat transfer material), which overflows from the space between the sensor-closest MOS 123/223 and the motor housing 830 (the heat radiating member), from moving in the direction to the through-hole 837a of the rear frame end 837. For example, as shown in FIG. 8, the overflowing gel G is brought into contact with the sensor-neighboring mounted part/parts R and a further flow of the gel G to the through-hole 837a is blocked. More exactly, the flow direction of the gel G is changed from a radial-inward direction to the through-hole 837a to a circumferential direction. It is thereby possible to avoid a situation that the overflowing gel G is going to be brought into contact with and adhered to the rotating shaft 870, which is located in the through-hole 837a.

As above, it is possible to avoid the situation that the gel G going to be adhered to the rotating shaft 870 will scatter to the bearing 835 and thereby a sliding performance of the bearing 835 will be decreased. In addition, it is possible to avoid a situation that the gel G going to be adhered to the rotating shaft 870 will scatter to the magnet 875 and the rotational angle sensor 29 and thereby a detecting accuracy of the rotational angle sensor 29 may be decreased.

As above, it is possible to avoid a situation that the heat radiating performance is decreased, even when the sufficient amount of the gel G is adhered to the sensor-closest MOS 123/223. In addition, it is possible to avoid the situation that the gel G is adhered to the rotating shaft 870, the sliding performance of the bearing 835 is decreased, and the detection accuracy of the rotational angle sensor 29 is decreased. Accordingly, it is possible to increase the heat radiating performance of the sensor-closest MOS 123/223, the sliding performance of the rotating shaft 870, and the detection accuracy of the rotational angle sensor 29, even in a case that the electric power converting circuit (the ECU 10) is integrally formed with the electric motor 80.

In one of the prior arts, for example, in Japanese Patent Publication No. 2016-34203, a projection is provided in a motor housing for the purpose of preventing overflowing gel from being adhered to a rotating shaft. When such a projection is formed in the motor housing, a structure thereof may become complicated and a lifetime of a metal die for forming the motor housing may be shortened.

According to the present embodiment, however, the flow of the overflowing gel G in the direction to the rotating shaft is blocked by the sensor-neighboring mounted part/parts R, instead of forming the projection in the motor housing 830. Therefore, it is possible to increase the heat radiating performance of the sensor-closest MOS 123/223, the sliding performance of the rotating shaft 870 and the detection accuracy of the rotational angle sensor 29, without making the structure of the motor housing more complicated.

According to the present embodiment, the multiple sensor-neighboring mounted parts R are arranged in the direction, which intersects with the virtual center line C1 connecting the center of the through-hole opposing area A1 to the center of the sensor-closest MOS 123/223. It is possible to increase a blocking performance for blocking the flow of the overflowing gel G by the multiple sensor-neighboring mounted parts R, when compared with a case in which the flow of the overflowing gel G is blocked by one sensor-neighboring mounted part R.

According to the present embodiment, the direction in which the multiple sensor-neighboring mounted parts R are arranged coincides with the direction of the longitudinal side of the rectangular shape of the sensor-neighboring mounted part R. According to the above structure, it is possible to make wider an area in which the flow of the overflowing gel G is blocked, when compared with a case in which the parts arrangement direction intersects with the direction of the longitudinal side. In other words, it is possible to increase the blocking performance of the overflowing gel G by the sensor-neighboring mounted parts R.

In the present embodiment, a rotational angle detecting circuit 290 is provided, as shown in FIG. 7. The rotational angle detecting circuit 290, which is a circuit for detecting the rotational angle of the rotating shaft 870, includes the rotational angle sensor 29 and angle detecting electronic parts. The rotational angle sensor 29 is provided at the position in the through-hole opposing area A1. The angle detecting electronic parts include a noise removing capacitor, a resistor for regulating voltage of the sensor signal and other parts for the sensor.

Since the rotational angle sensor 29 is provided at the position in the through-hole opposing area A1, the structure of the driving device (the area of the printed circuit board occupied by the rotational angle detecting circuit 290) can be made compact when the electronic parts for the sensor are provided at positions neighboring to or in the through-hole opposing area A1. Therefore, in the present embodiment, the electronic parts, which are preferably located at the positions neighboring to or in the through-hole opposing area A1, are used as the sensor-neighboring mounted parts R for blocking the flow of the overflowing gel G. As a result, the layout of the wiring patterns for the sensor-neighboring mounted parts R can be simplified.

Second Embodiment

In the above first embodiment, the sensor-neighboring mounted parts R, which are located between the through-hole opposing area A1 and the sensor-closest MOS 123/223, are arranged in the direction intersecting with the virtual center line C1. The above multiple parts of the sensor-neighboring mounted parts R are arranged in one straight line, as shown in FIG. 7. According to a second embodiment, the sensor-neighboring mounted parts R, which are located between the through-hole opposing area A1 and the sensor-closest MOS 123/223, are arranged in the direction intersecting with the virtual center line C1 and in multiple parallel lines, as shown in FIG. 9.

Figure 9:
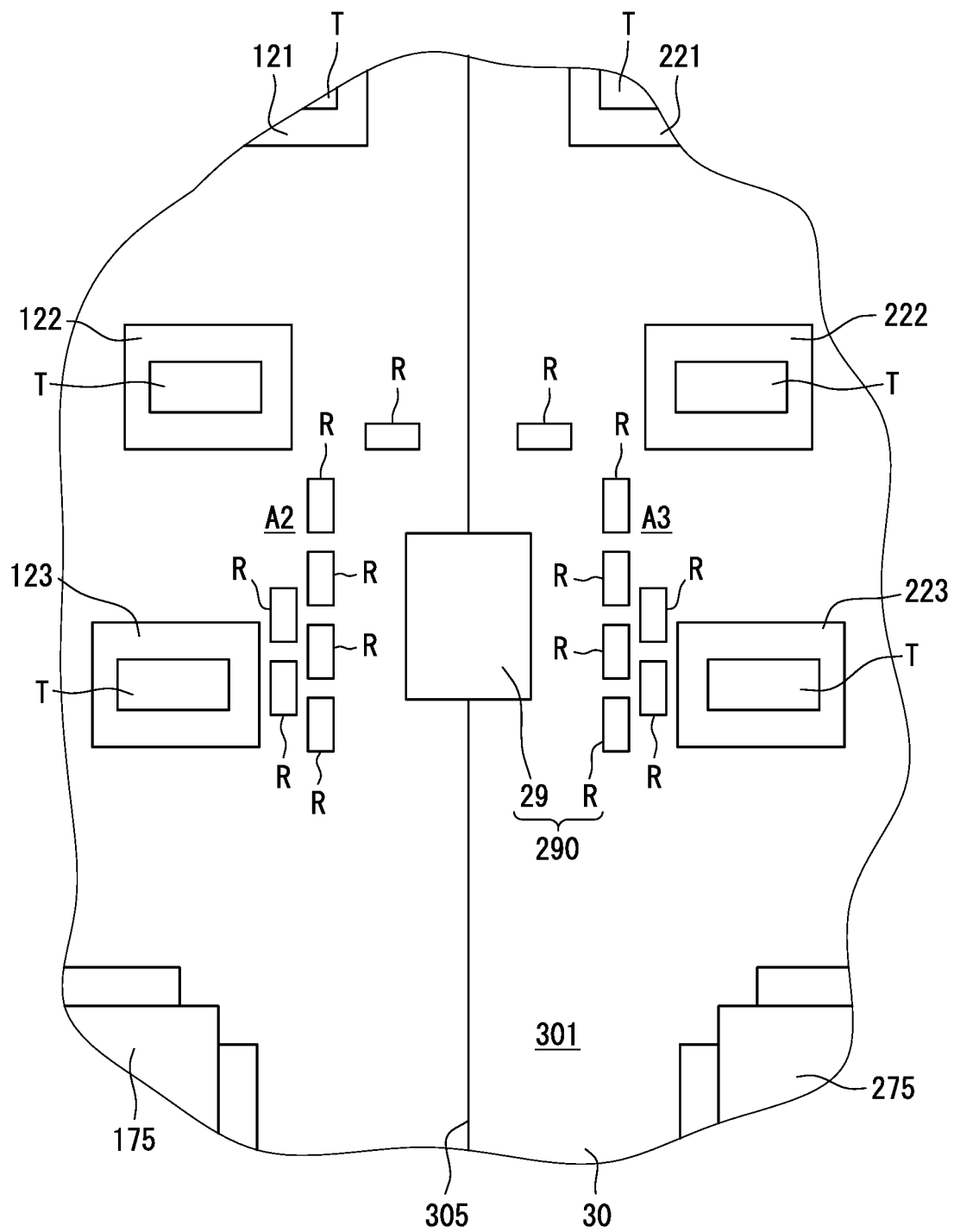
FIG. 9 is a schematically enlarged plane view showing a portion of a printed circuit board of the driving device according to a second embodiment, when viewed it in the axial direction from the bottom side thereof (in the axial direction from the electric motor to the printed circuit board)

In the present embodiment shown in FIG. 9, two lines extend in parallel to each other. The general mounted parts R in a first line (for example, a line of a left-hand side in the drawing) and the general mounted parts R in a second line (a line of a right-hand side in the drawing) are displaced from each other in the direction parallel to the slit 305. Each of the general mounted parts R of the first line is located at a position between the general mounted parts R of the second line, when viewed them in the direction perpendicular to the slit 305. In other words, the general mounted parts R of the first line and the general mounted parts R of the second line are alternately arranged in the direction parallel to the slit 305.

Since, in the present embodiment, the multiple sensor-neighboring mounted parts R are arranged in the multiple lines between the through-hole opposing area A1 and the sensor-closest MOS 123/223, it is possible to further increase the blocking performance for blocking the flow of the overflowing gel G, when compared with the first embodiment.

Third Embodiment

Figure 10:
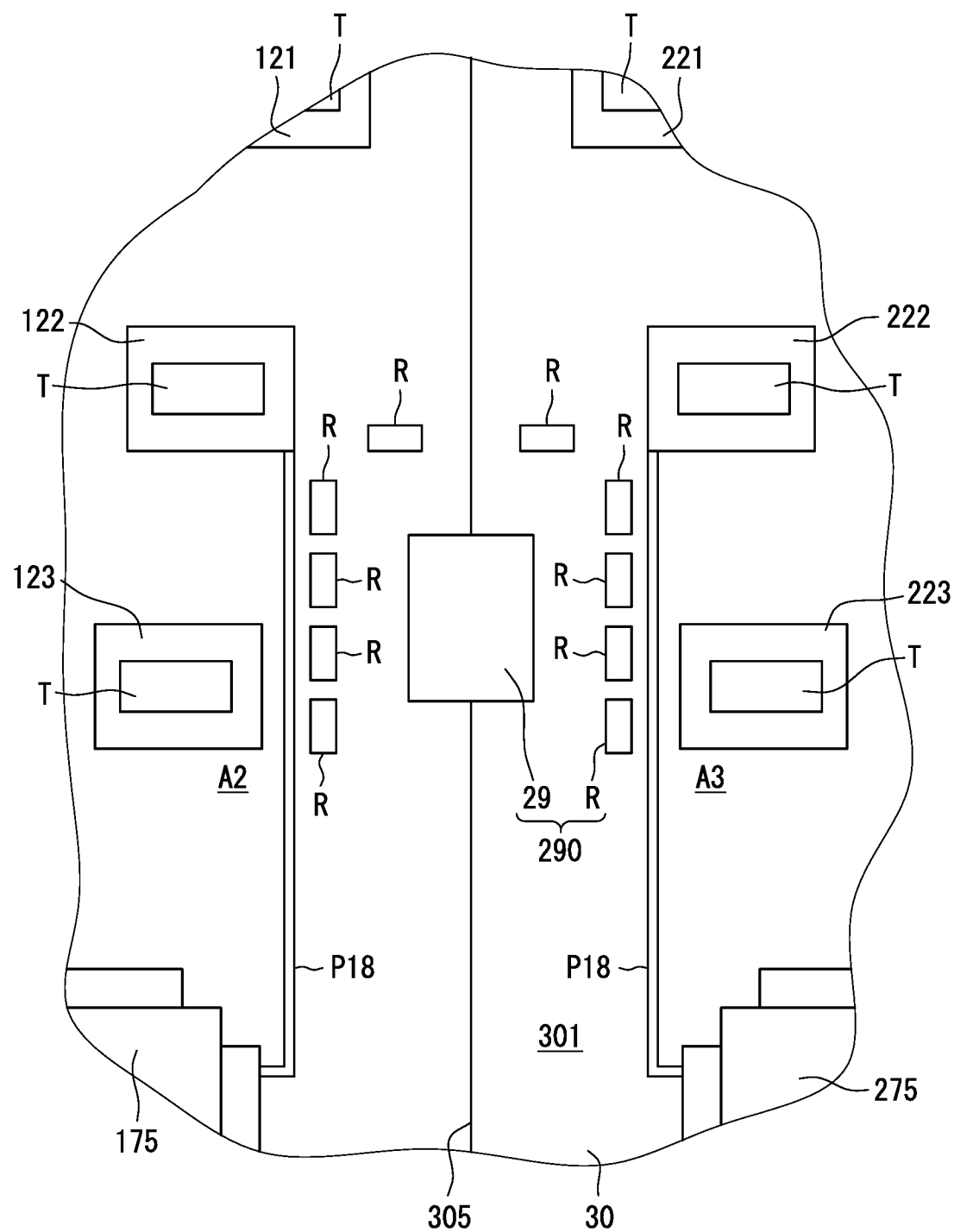
FIG. 10 is a schematically enlarged plane view showing a portion of a printed circuit board of the driving device according to a third embodiment, when viewed it in the axial direction from the bottom side thereof (in the axial direction from the electric motor to the printed circuit board).

According to a third embodiment, as shown in FIG. 10, a part of a control wiring pattern P18 is located at a position between the through-hole opposing area A1 and the sensor-closest MOS 123/223, when viewed them in the axial direction. More exactly, in a similar manner to the sensor-neighboring mounted parts R located between the through-hole opposing area A1 and the sensor-closest MOS 123/223, the control wiring pattern P18 is located in the MOS-sensor in-between area A2 or the terminal-sensor in-between area A3.

The control wiring pattern P18 located between the through-hole opposing area A1 and the sensor-closest MOS 123/223 extends in parallel to the parts arrangement direction, in which the multiple sensor-neighboring mounted parts R are arranged. In the present embodiment shown in FIG. 10, the direction in which the control wiring pattern P18 extends and the direction in which the multiple sensor-neighboring mounted parts R are arranged are parallel to the slit 305.

According to the present embodiment, it is possible to block the flow of the overflowing gel G in the direction to the through-hole 837a by not only the sensor-neighboring mounted parts R but also the control wiring pattern P18. It is thereby possible to increase the effect for preventing the gel G from being adhered to the rotating shaft 870.

As explained above, the control wiring pattern P18 has the function for blocking the flow of the overflowing gel G. However, another wiring pattern for the electric power converting circuit may have the function for blocking the flow of the overflowing gel G.

Further Embodiments and/or Modifications

The above embodiments can be combined with one another, whether or not such combinations are explicitly explained in the present disclosure. The present disclosure is not limited to the above embodiments and/or the modifications but can be further modified in various manners without departing from a spirit of the present disclosure, for example, as below.

(M1) In the first embodiment, the rear frame end 837 (a part of the motor housing 830) is used as the heat radiating member, with which the gel G is in contact. However, any other member than the motor housing 830 can be used as the heat radiating member. For example, a heat sink, which is formed as a member separated from the motor housing 830, may be used as the heat radiating member.

(M2) In the first embodiment, the multiple sensor-neighboring mounted parts R are arranged at the position between the through-hole opposing area A1 and the sensor-closest MOS 123/223. Alternatively, one sensor-neighboring mounted part R may be arranged at the position between them. In addition, in the first embodiment, the multiple sensor-neighboring mounted parts R are linearly arranged. However, it is not always necessary to linearly arrange those parts R. In addition, in the first embodiment, the direction of each sensor-neighboring mounted part R (for example, the direction of the longitudinal side of the rectangular shape of the part R) arranged at the position between the through-hole opposing area A1 and the sensor-closest MOS 123/223 is the same to one another. However, it is not always necessary to make the direction of each sensor-neighboring mounted part R to be the same to one another.

(M3) In the first embodiment, the sensor-neighboring mounted parts R arranged between the through-hole opposing area A1 and the sensor-closest MOS 123/223 are composed of those mounted parts for the rotational angle sensor 29. Instead, the sensor-neighboring mounted parts R may comprise the mounted parts R for the MOS, which are connected to the sensor-closest MOS 123/223.

(M4) In the first embodiment, the projection for blocking the flow of the overflowing gel, which is disclosed in the above explained prior art (JP 2016-34203), is not provided. However, such a projection may be provided in the motor housing 830. In this modification, the flow of the overflowing gel is blocked by not only the sensor-neighboring mounted parts R but also the projection.

(M5) In the above embodiments, the sensor-neighboring mounted parts R arranged at the position between the through-hole opposing area A1 and the sensor-closest MOS 123/223 are composed of surface-mounted parts. However, the sensor-neighboring mounted parts R may include insertion-mounted parts. Such a part having a terminal exposed to an outside and contacted with the gel G is not included in the sensor-neighboring mounted parts R, since the sensor-neighboring mounted parts R have the function for blocking the movement of the overflowing gel G.

(M6) In the first embodiment shown in FIG. 2, the through-hole 837a is formed in the rear frame end 837 and the rotating shaft 870 is inserted into the through-hole 837a. The magnet 875 attached to the axial end of the rotating shaft 870 is exposed to the outside of the through-hole 837a, so that the magnet 875 is opposed to the rotational angle sensor 29. However, it may be so modified that the through-hole 837a is not formed and a part of the rear frame end 837 is located between the rotational angle sensor 29 and the magnet 875. In this modification, the rotational angle sensor 29 is preferably located at the position on the center axis Ax of the rotating shaft 870.

(M7) In the first embodiment shown in FIG. 1, the electric power converting circuit (the ECU 10) supplies the electric power to the electric motor 80 of the EPS 8. The electric power converting circuit may alternatively supply the electric power to any other electric motors, for example, an electric motor for a vehicle driving. The electric power converting circuit mounted to the printed circuit board 30 includes the circuit for the inverters 120 and 220. However, the electric power converting circuit may include a booster circuit.

(M8) In the embodiment shown in FIG. 3, the parts and components for the first power control system L1 and the parts and components for the second power control system L2 are mounted to the same printed circuit board 30. However, the parts and components for the first power control system L1 and the parts and components for the second power control system L2 may be mounted to different printed circuit boards. The parts and components of the first power control system L1 include the first inverter 120, the first motor relays 127-129, the first battery relays 131-132, the first capacitor 134, the first coil 135 and so on. The parts and components of the second power control system L2 include the second inverter 220, the second motor relays 227-229, the second battery relays 231-232, the second capacitor 234, the second coil 235 and so on.

(M9) In the embodiment shown in FIG. 3, each of the switching elements 121-126, the motor relays 127-129 and the battery relays 131-132 is composed of MOSFET (metal-oxide semiconductor field-effect transistor). However, each of the above parts may be composed of IGBT (insulated gate bipolar transistor), thyristors or the like. In addition, the battery relays 131 and 132 may be composed of a mechanical relay. In a similar manner to the first power control system L1, each of the parts for the second power control system L2 may be composed of IGBT, thyristors, mechanical relays and so on.

(M10) In the embodiment shown in FIG. 3, the ground-connecting capacitor 41 is provided. However, it is not always necessary to provide the ground-connecting capacitor 41. The ECU 10 has the first and the second motor ground capacitors 142 and 242. However, it is not always necessary to provide the first and the second motor ground capacitors 142 and 242. Each of the ground patterns or each of the battery patterns of the first and the second power control systems L1 and L2 are not always necessary to be separately provided in the respective areas divided by the slit 305.

In the above embodiments, the ground-connecting capacitor 41 is mounted to the printed circuit board 30 to electrically connect the ground of the first power control system L1 to the ground of the second power control system L2. According to the above structure, a circuit is formed through which the noise transmitted to the other power control system via the phase coils of the first and/or the second motor winding groups 180 and 280 can return to the one power control system on the same printed circuit board 30. Each of the motor ground capacitors 142 and 242 connects each of the housing-connecting wiring patterns 156-157 & 256-257 to the ground pattern of the printed circuit board 30. According to the above structure, a circuit of a low impedance is formed through which the noise transmitted to the electric motor 80 can be returned to the ECU 10 having the inverters 120 and 220. As above, it is possible to decrease the transfer of the noise to the outside of the driving device 1, for example, to the vehicle side.

(M11) In the first embodiment, the control circuit is respectively provided for each of the electric power converting circuits of the two power control systems L1 and L2. In other words, the control circuit is provided for each of the power control systems L1 and L2. However, one control circuit may be provided commonly for the electric power converting circuits of two power control systems. Furthermore, one control circuit and one electric power converting circuit may be provided instead of two control circuits and two electric power converting circuits.

What is claimed is:

1. A driving device comprising:
an electric motor having a rotating shaft;
a motor housing for accommodating the electric motor and having a through-hole through which the rotating shaft is inserted;
a printed circuit board fixed to the motor housing and having a through-hole opposing area on a motor-side surface of the printed circuit board, the through-hole opposing area being opposed to an axial end of the rotating shaft in an axial direction perpendicular to the printed circuit board;
a rotational angle sensor mounted to the printed circuit board in the through-hole opposing area;
an electric power converting circuit having multiple switching elements for converting electric power and supplying such converted electric power to the electric motor, each of the multiple switching elements being mounted to the motor-side surface and one of the multiple switching elements located at a position closest to the rotational angle sensor being defined as a sensor-closest switching element;
a heat radiating member located on a side of the printed circuit board facing to the motor-side surface for radiating heat generated in the multiple switching elements;
a heat transfer material plastically deformed and adhered to the multiple switching elements and the heat radiating member for transferring the heat from the multiple switching elements to the heat radiating member; and
multiple mounted parts, each of which is a part different from the multiple switching elements and mounted to the motor-side surface of the printed circuit board,
wherein one of the multiple mounted parts is defined as a sensor-neighboring mounted part, which is located at a position between the through-hole opposing area and the sensor-closest switching element when viewed them in the axial direction.

2. The driving device according to claim 1, wherein
the multiple mounted parts are provided as multiple sensor-neighboring mounted parts including the sensor-neighboring mounted part and each of them is located at the position between the through-hole opposing area and the sensor-closest switching element, and
the multiple sensor-neighboring mounted parts are arranged on a line in a direction intersecting with a virtual center line connecting a center of the through-hole opposing area to a center of the sensor-closest switching element.

3. The driving device according to claim 2, wherein
the multiple sensor-neighboring mounted parts are arranged on multiple lines, each of which intersects with the virtual center line.

4. The driving device according to claim 2, wherein
each of the multiple sensor-neighboring mounted parts has a rectangular shape when viewed it in the axial direction, and
the direction of the line, on which the multiple sensor-neighboring mounted parts are arranged, coincides with a direction of a longitudinal side of the rectangular shape.

5. The driving device according to claim 1, further comprising:
a control circuit for controlling an operation of the multiple switching elements, and
a wiring pattern provided in the printed circuit board and connecting the control circuit to one of the multiple switching elements other than the sensor-closest switching element,
wherein a part of the wiring pattern is located at the position between the through-hole opposing area and the sensor-closest switching element, when viewed them in the axial direction.

6. The driving device according to claim 1, further comprising:
a rotational angle detecting circuit for detecting a rotational angle of the rotating shaft and
the rotational angle sensor for outputting a detection signal depending on the rotational angle of the rotating shaft; and
an electric detecting part,
wherein the rotational angle sensor is located in the through-hole opposing area, and
wherein the electric detecting part is arranged as one of multiple sensor-neighboring mounted parts, which is located between the through-hole opposing area and the sensor-closest switching element.

7. The driving device according to claim 1, wherein
the electric motor is applied to an electric power steering system for assisting a steering force for a vehicle.

* * * * *